(12) United States Patent
Huang et al.

(10) Patent No.: US 12,284,891 B2
(45) Date of Patent: Apr. 22, 2025

(54) STRETCHABLE PIXEL ARRAY SUBSTRATE

(71) Applicant: AUO Corporation, Hsinchu (TW)

(72) Inventors: Zih-Shuo Huang, Hsinchu (TW); Tsung-Ying Ke, Hsinchu (TW)

(73) Assignee: AUO Corporation, Hsinchu (TW)

( * ) Notice: Subject to any disclaimer, the term of this patent is extended or adjusted under 35 U.S.C. 154(b) by 504 days.

(21) Appl. No.: 17/888,515

(22) Filed: Aug. 16, 2022

(65) Prior Publication Data

US 2023/0354657 A1   Nov. 2, 2023

(30) Foreign Application Priority Data

Apr. 28, 2022   (TW) ................................. 111116275

(51) Int. Cl.
| | | |
|---|---|---|
| *H10K 59/131* | (2023.01) | |
| *H10K 77/10* | (2023.01) | |
| *H10K 102/00* | (2023.01) | |

(52) U.S. Cl.
CPC ......... *H10K 59/131* (2023.02); *H10K 77/111* (2023.02); *H10K 2102/311* (2023.02)

(58) Field of Classification Search
CPC .............. H10K 59/131; H10K 77/111; H10K 2102/311
USPC ......................................................... 257/40
See application file for complete search history.

(56) References Cited

U.S. PATENT DOCUMENTS

| | | | | |
|---|---|---|---|---|
| 9,844,133 | B2* | 12/2017 | Tomita .................... | H05K 1/038 |
| 12,114,558 | B2* | 10/2024 | Sui ........................ | H10K 59/131 |
| 2014/0299362 | A1* | 10/2014 | Park ...................... | H05K 1/0283 |
| | | | | 174/254 |
| 2015/0380355 | A1* | 12/2015 | Rogers .................... | H01L 24/97 |
| | | | | 257/773 |
| 2020/0051964 | A1* | 2/2020 | Jung ...................... | H10K 59/121 |
| 2021/0210523 | A1* | 7/2021 | Sui ......................... | H10D 86/60 |
| 2024/0023238 | A1* | 1/2024 | Wang ...................... | G09F 9/301 |

FOREIGN PATENT DOCUMENTS

| | | |
|---|---|---|
| CN | 109920334 | 4/2021 |
| CN | 112863340 | 5/2021 |
| CN | 113555346 | 10/2021 |
| TW | 202303551 | 1/2023 |

* cited by examiner

*Primary Examiner* — Matthew E. Gordon
(74) *Attorney, Agent, or Firm* — JCIPRNET

(57) ABSTRACT

A stretchable pixel array substrate includes a base, pixel structures, and a wiring. The base has first regions and a second region. The pixel structures are respectively disposed on the first regions of the base. The wiring is disposed on the second region of the base. Curved segments of the wiring include a first curved segment and a second curved segment. One of the pixel structures is disposed on one of the first regions. The first curved segment is disposed between the one of the pixel structures and the second curved segment. A distance A exists between a first curved portion and a second curved portion of the first curved segment in a first direction, a distance B exists between a first curved portion and a second curved portion of the second curved segment in the first direction, and A>B.

6 Claims, 8 Drawing Sheets

STRETCHABLE PIXEL ARRAY SUBSTRATE

CROSS-REFERENCE TO RELATED APPLICATION

This application claims the priority benefit of Taiwan application serial no. 111116275, filed on Apr. 28, 2022. The entirety of the above-mentioned patent application is hereby incorporated by reference herein and made a part of this specification.

BACKGROUND

Technical Field

The disclosure relates to a pixel array substrate and particularly relates to a stretchable pixel array substrate.

Description of Related Art

The highly developed electronic technologies lead to constant innovation of electronic products. In order to adapt the electronic products to various technical fields, the characteristics of stretchability, light weight and compactness, and flexible appearance have gradually drawn the attention. That is, the electronic products have been required to have different appearances in response to different application manner and environments, and thus the electronic products should have the stretchability.

However, when the electronic products are being stretched, the electronic products bearing the stress may encounter the issue of structural fracture and even open circuit in the electronic products. Therefore, how to ensure the reliability of the stretchable electronic products is one of the issues to be solved at present.

SUMMARY

The disclosure relates to a stretchable pixel array substrate with good stretchability.

According to an embodiment of the disclosure, a stretchable pixel array substrate includes a base, a plurality of pixel structures, and a wiring. The base has a plurality of first regions and a second region, wherein the second region is located among the first regions. The pixel structures are respectively disposed on the first regions of the base. The wiring is disposed on the second region of the base and electrically connected to the pixel structures. The wiring includes a plurality of curved segments serially connected to each other, each of the curved segments has a first curved portion, a second curved portion, and a third curved portion. The second curved portion is connected between the first curved portion and the third curved portion. A curved direction of the first curved portion is different from a curved direction of the third curved portion. The third curved portion of each of the curved segments is connected to the first curved portion of the next curved segment. The curved segments of the wiring include a first curved segment and a second curved segment. The first curved segment is a curved segment of the wiring closest to one of the first regions. One of the pixel structures is disposed on the one of the first regions, and the first curved segment is disposed between the one of the pixel structures and the second curved segment. A distance A exists between the first curved portion of the first curved segment and the second curved portion of the first curved segment in a first direction, a distance B exists between the first curved portion of the second curved segment and the second curved portion of the second curved segment in the first direction, and A>B.

In an embodiment of the disclosure, $1<(A/B)<10$.

In an embodiment of the disclosure, $1<(A/B)<4$.

In an embodiment of the disclosure, the one of the first regions has a width W, and $A \leq W$.

In an embodiment of the disclosure, the first curved segment further includes a first straight portion and a second straight portion. The first straight portion is connected between the first curved portion and the second curved portion. The second straight portion is connected between the second curved portion and the third curved portion. The first direction intersects with a second direction, and a distance S exists between the first straight portion and the second straight portion in the second direction.

In an embodiment of the disclosure, the first straight portion has a length L, and $L>S$.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
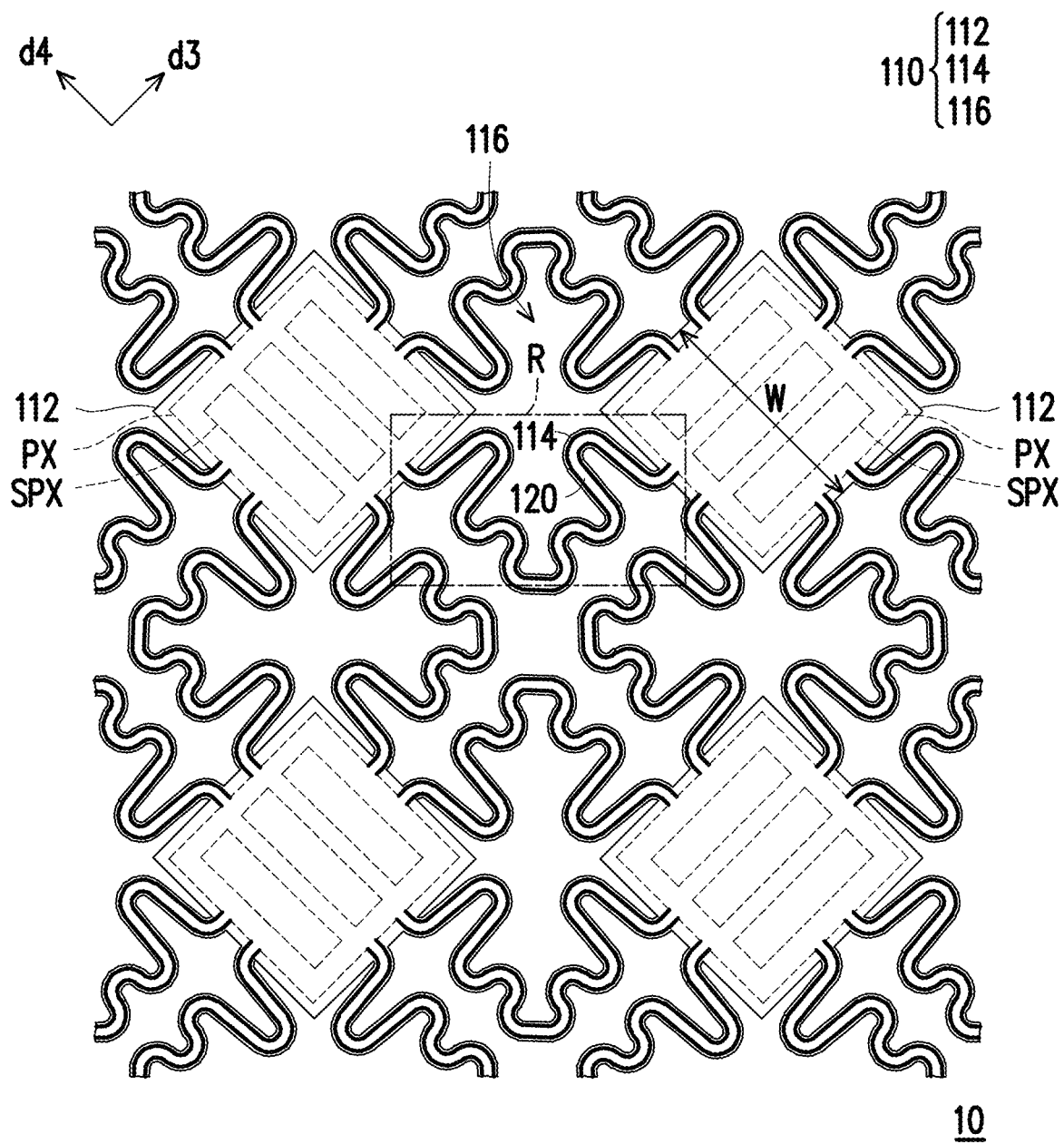
FIG. 1 is a schematic top view illustrating a stretchable pixel array substrate 10 according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

It should be understood that when an element such as a layer, film, region, or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the terminology "connected" may refer to physically connected and/or electrically connected. Therefore, intervening elements may be present between two elements when the two elements are "electrically connected" or "coupled" to each other.

The terminology "about," "approximately," or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For instance, "approximately" may mean within one or more standard deviations, or within, for instance, ±30%, ±20%, ±10%, ±5% of the stated value. Moreover, a relatively acceptable range of deviation or standard deviation may be chosen for the terminology "about," "approximately," or "substantially" as used herein based on optical properties, etching properties or other properties, instead of applying one standard deviation across all the properties.

Unless otherwise defined, all terminologies (including technical and scientific terminologies) used herein have the same meaning as commonly understood by persons of ordinary skill in the art. It will be further understood that terminologies, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 2:
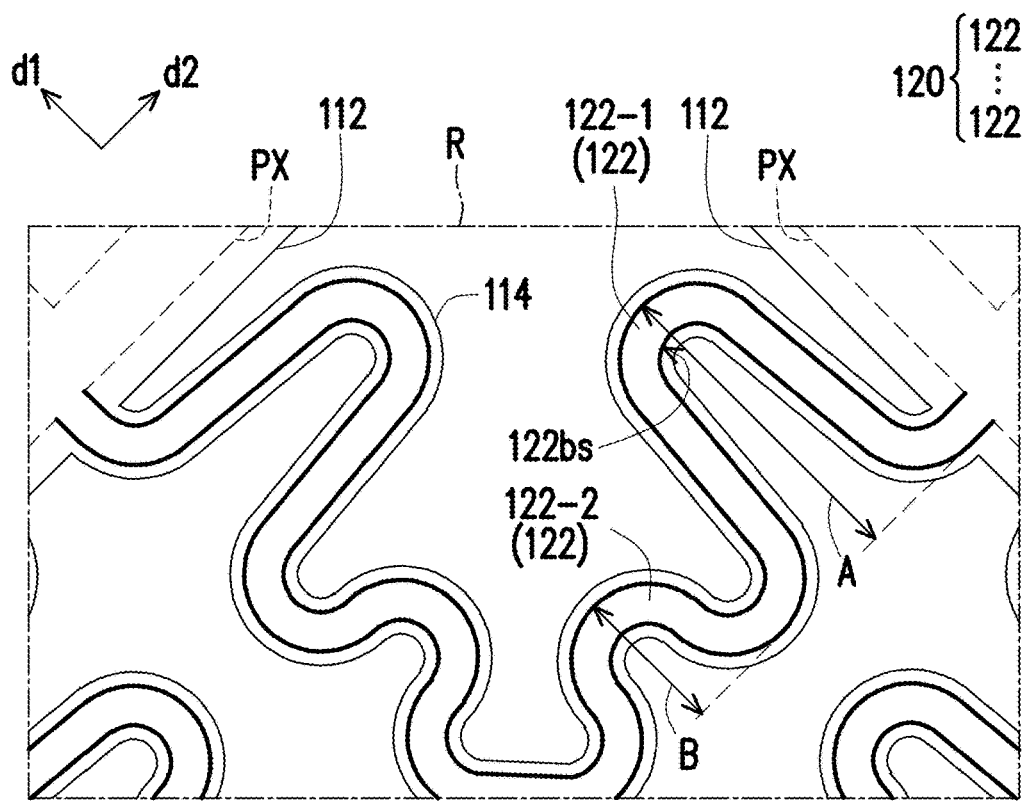
FIG. 2 is a schematic partial enlarged view illustrating the stretchable pixel array substrate 10 according to an embodiment of the disclosure.

FIG. 1 is a schematic top view illustrating a stretchable pixel array substrate 10 according to an embodiment of the disclosure. FIG. 2 is a schematic partial enlarged view illustrating the stretchable pixel array substrate 10 according to an embodiment of the disclosure. FIG. 2 corresponds to a portion R in FIG. 1.

With reference to FIG. 1 and FIG. 2, the stretchable pixel array substrate 10 includes a base 110. The base 110 has a plurality of first regions 112 and a second region 114, wherein the second region 114 is located among the first regions 112. In this embodiment, the base 110 may optionally have a plurality of through holes 116 to define a plurality of islands and a bridge of the base 110. Here, the islands are the first regions 112 of the base 110, and the bridge is the second region 114 of the base, which should however not be construed as a limitation in the disclosure. In other embodiments, the base 110 may not have the through holes 116, and the base 110 may be a complete solid base.

The base 110 is configured to carry other components of the stretchable pixel array substrate 10. The base 110 is flexible and extensible and thus can be stretched. For instance, in this embodiment, a material of the base 110 may include polyimide (PI), polyethylene naphthalate (PEN), polyethylene terephthalate (PET), polycarbonates (PC), polyether sulfone (PES), polyarylate, any other appropriate material, or a combination of at least two of the above-mentioned materials, which should however not be construed as a limitation in the disclosure.

With reference to FIG. 1, the stretchable pixel array substrate 10 further includes a plurality of pixel structures PX. The pixel structures PX are disposed on the first regions 112 of the base 110, respectively. Each of the first regions 112 is provided with at least one of the pixel structures PX, and each of the pixel structures PX includes at least one sub-pixel structure SPX. For instance, in this embodiment, each of the first regions 112 may be provided with one of the pixel structures PX, and the one of the pixel structures PX may include three sub-pixel structures SPX for displaying red, blue, and green colors, respectively, which should however not be construed as a limitation in the disclosure.

Figure 3:
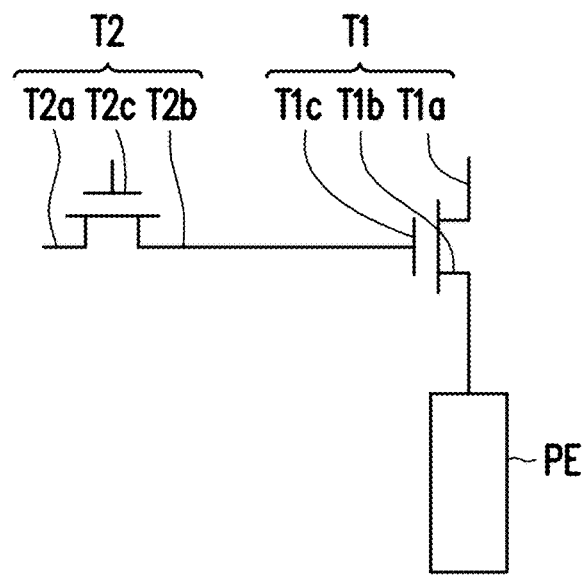
FIG. 3 is a schematic view illustrating an equivalent circuit of a sub-pixel structure SPX of the stretchable pixel array substrate 10 according to an embodiment of the disclosure.

FIG. 3 is a schematic view illustrating an equivalent circuit of a sub-pixel structure SPX of the stretchable pixel array substrate 10 according to an embodiment of the disclosure.

With reference to FIG. 1 and FIG. 3, for instance, in this embodiment, each of the sub-pixel structures SPX may include a first transistor T1 and a pixel electrode PE, the first transistor T1 has a first terminal T1a, a second terminal T1b, and a control terminal T1c, and the pixel electrode PE is electrically connected to the second terminal T1b of the first transistor T1. In this embodiment, each of the sub-pixel structures SPX may further optionally include a second transistor T2 having a first terminal T2a, a second terminal T2b, and a control terminal T2c, and the second terminal T2b of the second transistor T2 is electrically connected to the control terminal T1c of the first transistor T1.

With reference to 1 and FIG. 2, the stretchable pixel array substrate 10 further includes a wiring 120 that is disposed on the second region 114 of the base 110 and electrically connected to the pixel structures PX respectively located on the first regions 112. With reference to FIG. 1, FIG. 2, and FIG. 3, in this embodiment, the wiring 120 is, for instance, a gate driver line that is electrically connected to the control terminals T2c of the second transistors T2 of the sub-pixels SPX of the pixel structures PX respectively located on the first regions 112, which should however not be construed as a limitation in the disclosure. In other embodiments, the wiring 120 may also be a data line, a power line, a common line, or any other type of conductive wire, wherein the data line is electrically connected to the first terminals T2a of the second transistors T2 of the sub-pixel structures SPX of the pixel structures PX respectively located on the first regions 112, and the power line is electrically connected to the first terminals T1a of the first transistors T1 of the sub-pixel structures SPX of the pixel structures PX respectively located on the first regions 112.

Figure 4:
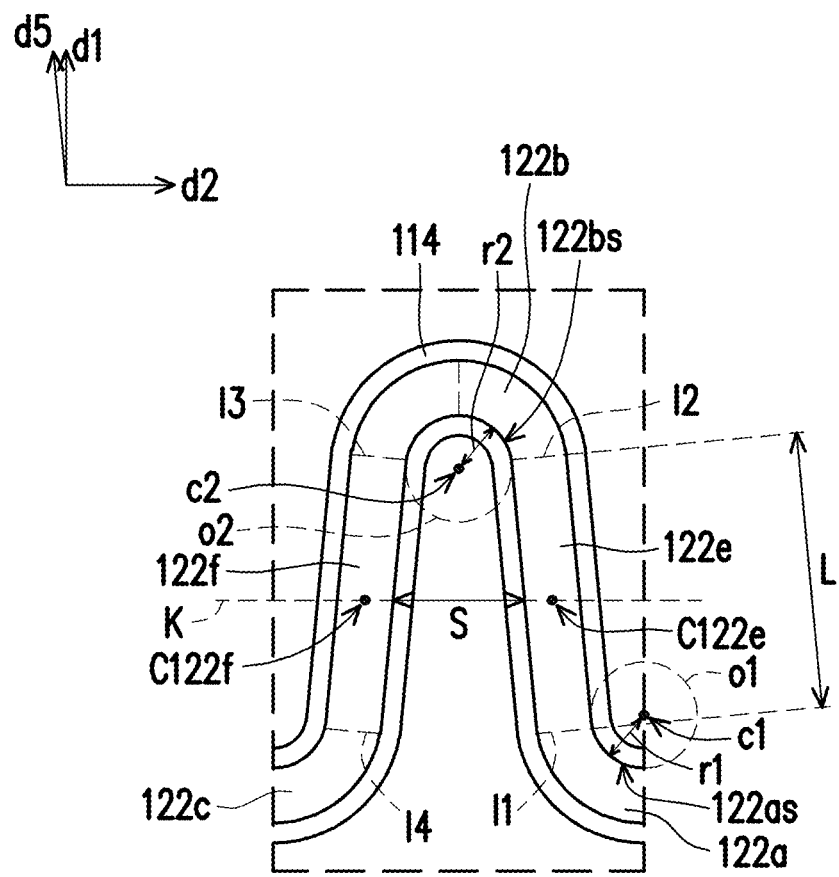
FIG. 4 is a schematic enlarged view illustrating a curved segment 122 of a wiring 120 according to an embodiment of the disclosure.

FIG. 4 is a schematic enlarged view of a curved segment 122 of the wiring 120 according to an embodiment of the disclosure.

With reference to FIG. 1, FIG. 2, and FIG. 4, the wiring 120 includes a plurality of curved segments 122 that are serially connected to each other. With reference to FIG. 2 and FIG. 4, each of the curved segments 122 has a first curved portion 122a (marked in FIG. 4), a second curved portion 122b (marked in FIG. 4) and a third curved portion 122c (marked in FIG. 4), wherein the second curved portion 122b is connected between the first curved portion 122a and the third curved portion 122c, and a direction in which the first curved portion 122a is curved is different from a direction in which the third curved portion 122c is curved. With reference to FIG. 4, for instance, the first curved portion 122a and the third curved portion 122c may be curved toward the upper right and the upper left, respectively, and the second curved portion 122b may be curved downward.

With reference to FIG. 2 and FIG. 4, the third curved portion 122c of each of the curved segments 122 is connected to the first curved portion 122a of the next curved segment 122. For instance, in this embodiment, the curved segments 122 of the wiring 120 include a first curved segment 122-1 and second curved segment 122-2, the first curved segment 122-1 is located between the second curved segment 122-2 and the pixel structure PX on the right side, the first curved portion 122a of the first curved segment 122-1 is connected to the pixel structure PX on the right, and the third curved portion 122c of the first curved segment 122-1 is connected to the first curved portion 122a of the second curved segment 122-2.

With reference to FIG. 1 and FIG. 2, the curved segments 122 of the wiring 120 include the first curved segment 122-1 and the second curved segment 122-2, the first curved segment 122-1 is one of the curved segments 122 of the wiring 120 closest to one of the first regions 112 in (e.g., the first region 112 on the right side in FIG. 2), one of the pixel structures PX is disposed on the one of the first regions 112, and the first curved segment 122-1 is disposed between the one of the pixel structures PX and the second curved segment 122-2. In this embodiment, the first curved segment 122-1 is directly connected to the pixel structures PX, and the second curved segment 122-2 is directly connected to the first curved segment 122-1.

With reference to FIG. 2 and FIG. 4, a distance A exists between the first curved portion 122a of the first curved segment 122-1 and the second curved portion 122b of the first curved segment 122-1 in a first direction d1, and a distance B exists between the first curved portion 122a of the second curved segment 122-2 and the second curved portion 122b of the second curved segment 122-2 in the first direction d1. Note that A>B. That is, an amplitude of one of the curved segments 122 closest to one of the first regions 112 (i.e., the distance A) is greater than an amplitude of another curved segment 122 away from the one of the first regions 112 (i.e., distance B). In the entire wiring 120, an inner side 122bs of the second curved portion 122b of one of the curved segments 122 closest to one of the first regions 112 bears the greatest strain. Through the design of A>B, the maximum strain that the wiring 120 bears may be significantly reduced, thereby greatly improving the stretchability of the stretchable pixel array substrate 10. The above description is substantiated by what is described below and illustrated in FIGS. 5 and 6.

Figure 5:
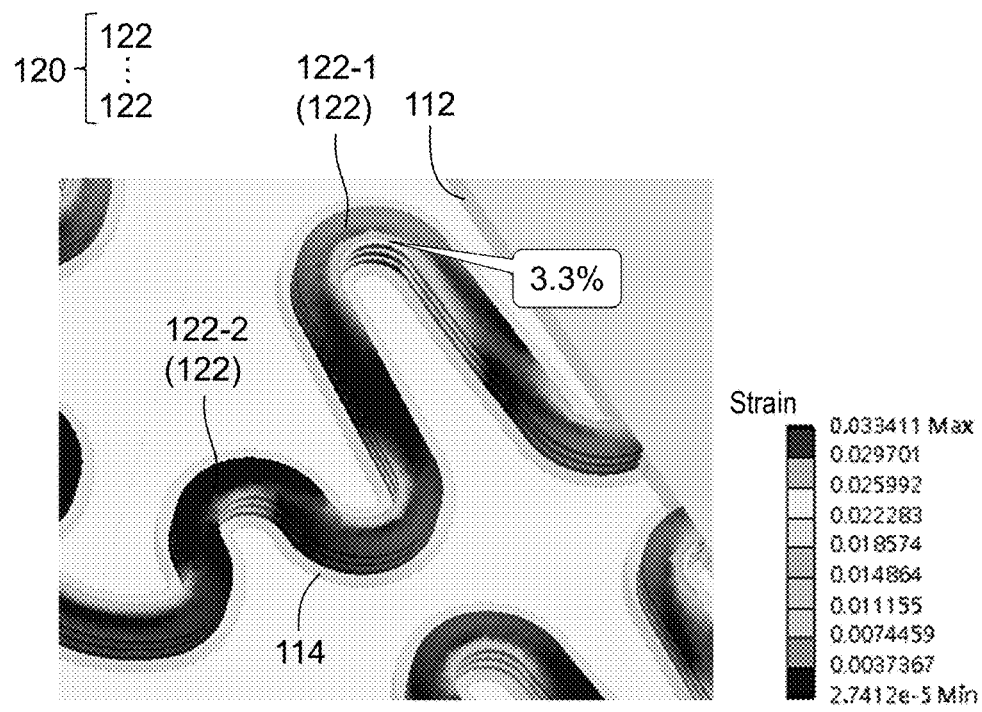
FIG. 5 illustrates a strain on the wiring 120 of the stretchable pixel array substrate 10 according to an embodiment of the disclosure.
Figure 6:
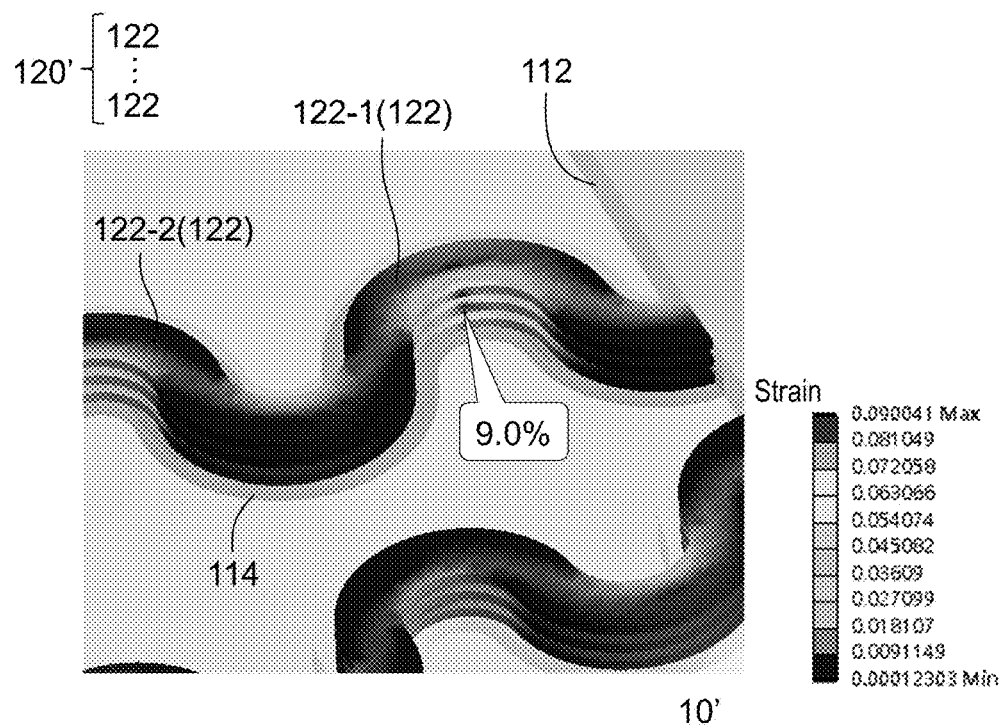
FIG. 6 illustrates a strain on a wiring 120' of a stretchable pixel array substrate 10' according to a comparison example.

FIG. 5 illustrates a strain on the wiring 120 of the stretchable pixel array substrate 10 according to an embodiment of the disclosure. FIG. 6 illustrates a strain on a wiring 120' of a stretchable pixel array substrate 10' according to a comparison example.

The stretchable pixel array substrate 10' of the comparison example depicted in FIG. 6 is similar to the stretchable pixel array substrate 10 of the embodiment depicted in FIG. 5, while the differences lie in that: in the stretchable pixel array substrate 10 of the embodiment depicted in FIG. 5, the amplitude of one of the curved segments 122 closest to one of the first regions 112 is greater than the amplitude of another curved segment 122 away from the first region 112; however, in the stretchable pixel array substrate 10' in the comparison example depicted in FIG. 6, the amplitude of each curved segment 122 is the same. It may be learned from the data shown in FIG. 5 and FIG. 6 that the maximum strain which the wiring 120 bears may be greatly reduced to 3.3% as compared to the maximum strain 9.0% which the wiring 120' bears by designing the amplitude of one of the curved segments 122 closest to one of the first regions 112 to be greater than that of another curved segment 122 away from the first region 112.

With reference to FIG. 2, in this embodiment, $1<(A/B)<10$; that is, the amplitude of one of the curved segments 122 closest to one of the first regions 112 is greater than the amplitude of another curved segment 122 away from the first region 112 and less than 10 times the amplitude of the another curved segment 122. Preferably, $1<(A/B)<4$. That is, the amplitude of one of the curved segments 122 closest to one of the first regions 112 is greater than the amplitude of another curved segment 122 away from the first region 112 and less than 4 times the amplitude of the another curved segment 122, which should however not be construed as a limitation in the disclosure.

In addition, with reference to FIG. 1 and FIG. 2, each of the first regions 112 has a width W, and $A \leq W$. That is, the amplitude of one of the curved segments 122 closest to one of the first regions 112 (i.e., the distance A) is less than or equal to the width W of the first region 112 of the base 110. With reference to FIG. 1, in this embodiment, the first curved segment 122-1 and the second curved segment 122-2 are arranged in a third direction d3, a fourth direction d4 is perpendicular to the third direction d3, and the width W refers to a width of the first region 112 of the base 110 in the fourth direction d4.

With reference to FIG. 2 and FIG. 4, in this embodiment, the first curved segment 122-1 may also have a first straight portion 122e and a second straight portion 122f, wherein the first straight portion 122e is connected between the first curved portion 122a and the second curved portion 122b, and the second straight portion 122f is connected between the second curved portion 122b and the third curved portion 122c. Through the arrangement of the first straight portion 122e and the second straight portion 122f, the amplitude of the first curved segment 122-1 of the wiring 120 (i.e., the distance A) may be adjusted to reduce the maximum strain that the inner side 122bs of the second curved portion 122b of the first curved segment 122-1 of the entire wiring 120.

With reference to FIG. 2 and FIG. 4, the first direction d1 intersects with a second direction d2, a distance S exists between the first straight portion 122e and the second straight portion 122f of the first curved segment 122-1 in the second direction d2, the first straight portion 122e has a length L in an extension direction d5 toward which the first straight portion 122e extends, and L>S. In short, the length L of the first straight portion 122e is greater than the distance S between the first straight portion 122e and the second straight portion 122f.

Figure 7:
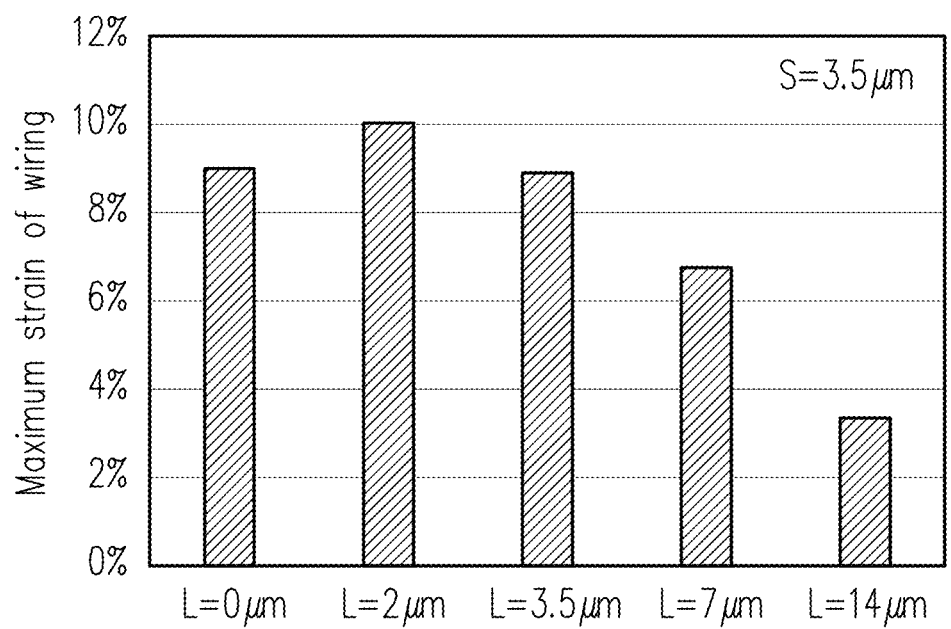
FIG. 7 illustrates a maximum strain of a wiring corresponding to respective lengths L in the stretchable pixel array substrate 10 according to an embodiment of the disclosure, given that a distance S remains at 3.5 μm.

FIG. 7 illustrates a maximum strain of a wiring corresponding to respective lengths L in the stretchable pixel array substrate 10 according to an embodiment of the disclosure, given that a distance S remains at 3.5 μm.

With reference to FIG. 4 and FIG. 7, it may be learned from the data shown in FIG. 7 that when 0<L<S, the maximum strain of the wiring (~10%) is greater than the maximum strain of the wiring (~9%) when L=0 µm; however, when L>S, the maximum strain of the wiring decreases significantly together with the increase in the length L. Accordingly, the design of L>S is conducive to the reduction of the maximum strain of the wiring and improvement of the stretchability.

With reference to FIG. 4, in this embodiment, it should be mentioned that borders I1 and I2 of the first straight portion 122e are defined by a curvature radius r1 of an edge of an inner side 122as as of the first curved portion 122a and a curvature radius r2 of an edge of the inner side 122bs of the second curved portion 122b, respectively. Specifically, the edge of the inner side 122as of the first curved portion 122a has a curvature center c1 and the curvature radius r1, a virtual circle of is drawn by defining the curvature center c1 as the center and the curvature radius r1 as the radius, and a portion of the wiring 120 within the range of ¼ of the perimeter of the virtual circle o1 is defined as the first curved portion 122a, so as to further define the boundary between the first curved portion 122a and the first straight portion 122e (i.e., the border I1); the edge of the inner side 122bs of the second curved portion 122b has a curvature center c2 and the curvature radius r2, a virtual circle o2 is drawn by defining the curvature center c2 as the center and the curvature radius r2 as the radius, and a portion of the wiring 120 within the range of ¼ of the perimeter of the virtual circle o2 is defined as the second curved portion 122b, so as to define the boundary between the second curved portion 122b and the first straight portion 122e (i.e., the border I2). A portion of the wiring 120 between the borders I1 and I2 is defined as the first straight portion 122e. The length L of the first straight portion 122e refers to the distance between the borders I1 and I2 in the extension direction d5 of the first straight portion 122e. Borders I3 and I4 of the second straight portion 122f may also be defined in a similar manner, which will not be repetitively described hereinafter.

In this embodiment, the first straight portion 122e and the second straight portion 122f may (optionally) not be completely parallel to each other. When the first straight portion 122e and the second straight portion 122f are not completely parallel to each other, the second direction d2 may be parallel to a line K connecting a geometric center C122e of the first straight portion 122e and a geometric center C122f of the second straight portion 122f, and the distance S between the first straight portion 122e and the second straight portion 122f may refer to the distance on the line K connecting the two geometric centers C122e and C122f, which should however not be construed as a limitation in the disclosure. In other embodiments, the first straight portion 122e and the second straight portion 122f may also be parallel to each other; when the first straight portion 122e and the second straight portion 122f are parallel to each other, the second direction d2 may be perpendicular to the first straight portion 122e, and the distance S between the first straight portion 122e and the second straight portion 122f may refer to the distance S between the two in a direction perpendicular to the first straight portion 122e.

Note that the reference numbers and some content provided in the following embodiments are derived from the reference numbers and some content provided in the previous embodiments, the same reference numbers serve to denote the same or similar elements, and the description of the same technical content is omitted. The omitted description may be derived from the description provided in the previous embodiments and will not be repeated in the following embodiments.

Figure 8:
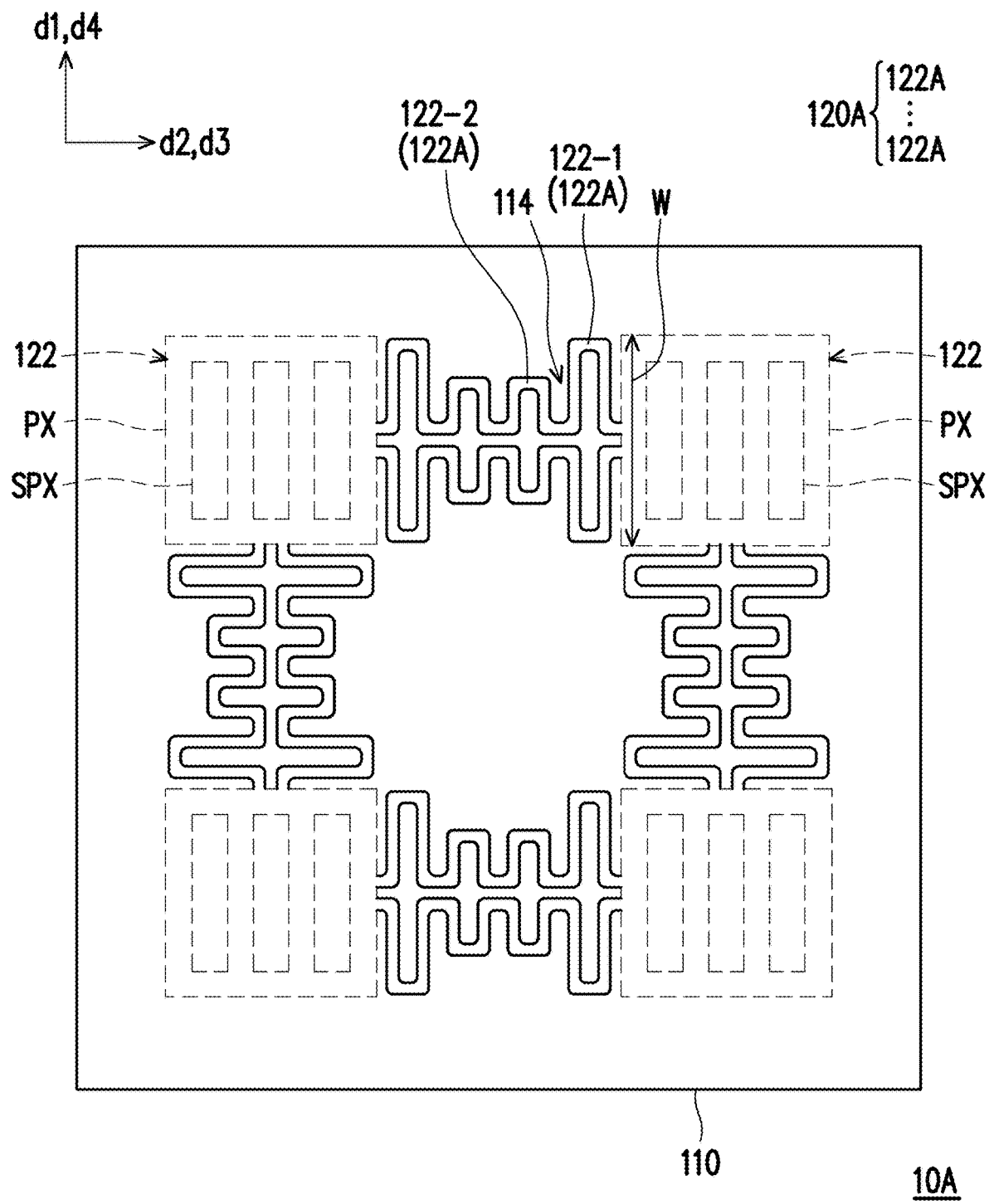
FIG. 8 is a schematic top view illustrating a stretchable pixel array substrate 10A according to another embodiment of the disclosure.

FIG. 8 is a schematic top view illustrating a stretchable pixel array substrate 10A according to another embodiment of the disclosure. The stretchable pixel array substrate 10A depicted in FIG. 8 is similar to the stretchable pixel array substrate 10 depicted in FIG. 1, while the differences lie in that: the base 110 of the stretchable pixel array substrate 10A depicted in FIG. 8 does not have the through holes 116 of the stretchable pixel array substrate 10 depicted in FIG. 1, and a wiring 120A of the stretchable pixel array substrate 10A depicted in FIG. 8 is different from the wiring 120 of the stretchable pixel array substrate 10 depicted in FIG. 1.

Figure 9:
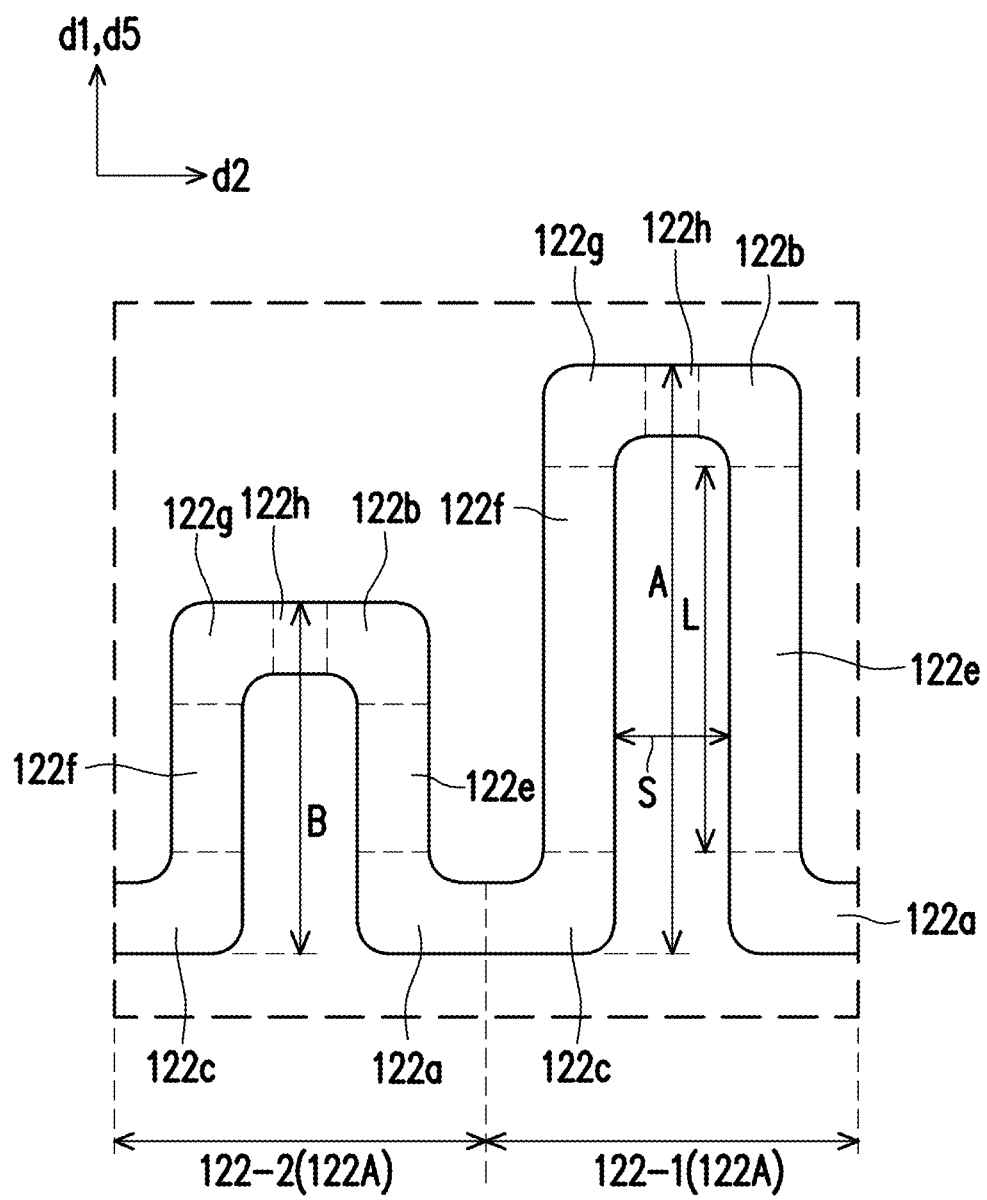
FIG. 9 is a schematic enlarged view illustrating a first curved segment 122-1 and a second curved segment 122-2 of the wiring 120 of the stretchable pixel array substrate 10A according to another embodiment of the disclosure.

FIG. 9 is a schematic enlarged view illustrating a first curved segment 122-1 and a second curved segment 122-2 of the wiring 120 of the stretchable pixel array substrate 10A according to another embodiment of the disclosure. With reference to FIG. 8 and FIG. 9, specifically, in this embodiment, in addition to the first curved portion 122a, the second curved portion 122b, the third curved portion 122c, the first straight portion 122e, and the second straight portion 122f, each of the curved segments 122 further includes a fourth curved portion 122g and a connection portion 122h, wherein a direction in which the fourth curved portion 122g is curved (e.g., toward the lower right) is different from a direction in which the second curved portion 122b is curved (e.g., toward the lower left), the connection portion 122h is connected between the second curved portion 122b and the fourth curved portion 122g, and the fourth curved portion 122g is connected between the connection portion 122h and the second straight portion 122f.

Figure 10:
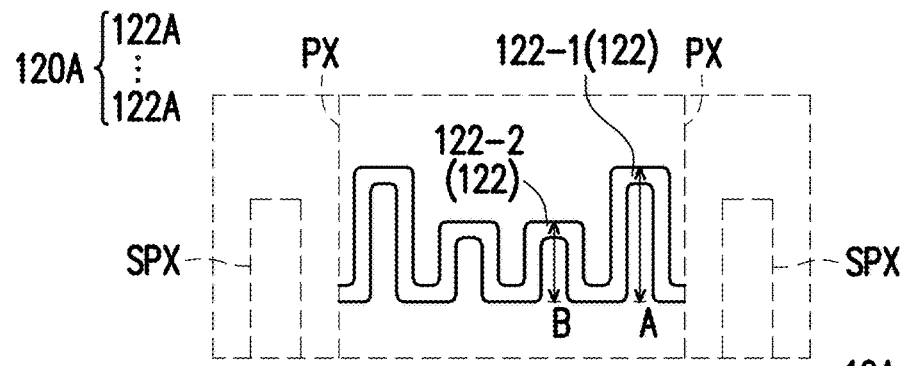
FIG. 10 is a schematic partial enlarged view illustrating the stretchable pixel array substrate 10A according to another embodiment of the disclosure.
Figure 11:
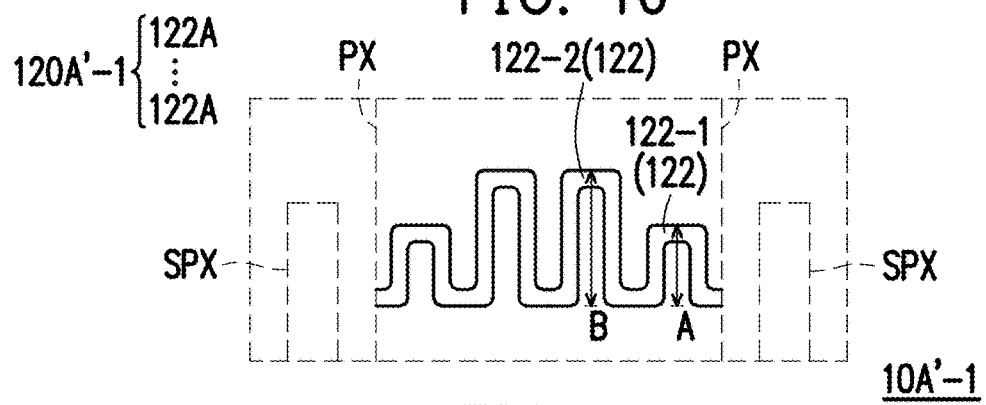
FIG. 11 is a schematic partial enlarged view illustrating a stretchable pixel array substrate 10A'-1 according to a comparison example.
Figure 12:
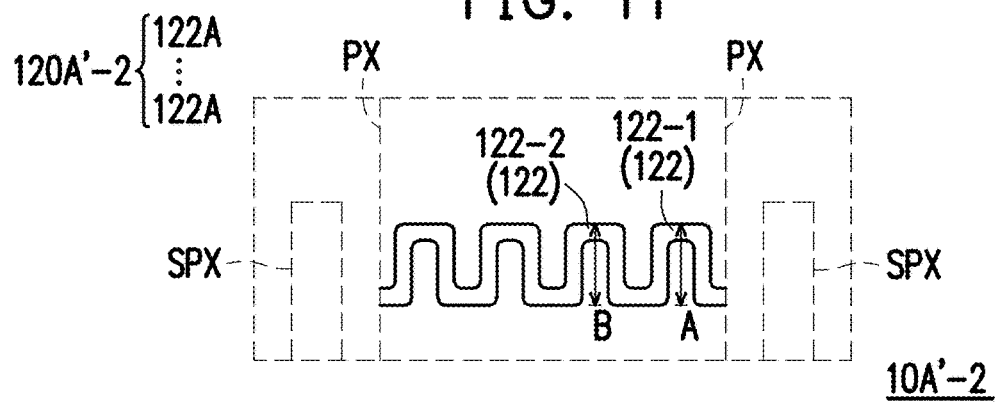
FIG. 12 is a schematic partial enlarged view illustrating a stretchable pixel array substrate 10A'-2 according to a comparison example.
Figure 13:
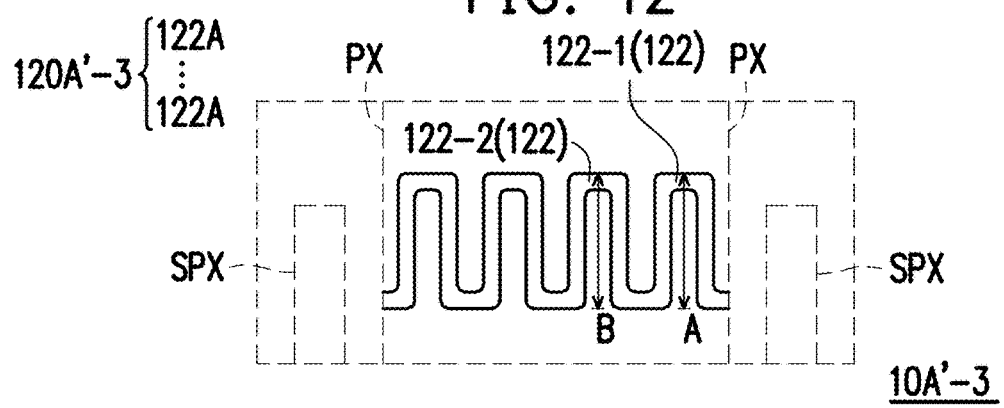
FIG. 13 is a schematic partial enlarged view illustrating a stretchable pixel array substrate 10A'-3 according to a comparison example.

FIG. 10 is a schematic partial enlarged view illustrating the stretchable pixel array substrate 10A according to another embodiment of the disclosure. FIG. 11 is a schematic partial enlarged view illustrating a stretchable pixel array substrate 10A'-1 according to a comparison example. FIG. 12 is a schematic partial enlarged view illustrating a stretchable pixel array substrate 10A'-2 according to a comparison example. FIG. 13 is a schematic partial enlarged view illustrating a stretchable pixel array substrate 10A'-3 according to a comparison example.

The stretchable pixel array substrates 10A'-1, 10A'-2, and 10A'-3 of the comparison examples depicted in FIG. 11, FIG. 12, and FIG. 13 are similar to the stretchable pixel array substrate 10A of the embodiment depicted in FIG. 10, while the differences lie in that a ratio of the distance A to the distance B in the stretchable pixel array substrates 10A'-1, 10A'-2, and 10A'-3 of the comparison example is different from a ratio of the distance A to the distance B in the stretchable pixel array substrate 10A of the embodiment depicted in FIG. 10.

Specifically, in the stretchable pixel array substrate 10A of the embodiment depicted in FIG. 10, the distance A and the distance B are 16 µm and 10 µm, respectively, and the ratio of the distance A to the distance B is A:B=16:10; in the stretchable pixel array substrate 10A'-1 of the comparison example depicted in FIG. 11, the distance A and the distance B are 10 µm and 16 µm, respectively, and the ratio of the distance A to the distance B is A:B=10:16; in the stretchable pixel array substrate 10A'-2 of the comparison example depicted in FIG. 12, the distance A and the distance B are 10 µm and 10 µm, respectively, and the ratio of the distance A to the distance B is A:B=10:10; in the stretchable pixel array substrate 10A'-3 of the comparison example depicted in FIG. 13, the distance A and distance B are 16 µm and 16 µm, respectively, and the ratio of the distance A to the distance B is A:B=16:16.

Table 1 below shows the strain and the resistance of the stretchable pixel array substrates 10A, 10A'-1, 10A'-2, and 10A'-3 provided in the embodiments and comparison examples depicted in FIG. 10 to FIG. 13.

TABLE 1

|  | Stretchable pixel array substrate 10A'-1 of the comparison example depicted in FIG. 11 | Stretchable pixel array substrate 10A of the embodiment depicted in FIG. 10 | Stretchable pixel array substrate 10A'-2 of the comparison example depicted in FIG. 12 | Stretchable pixel array substrate 10A'-3 of the comparison example depicted in FIG. 13 |
|---|---|---|---|---|
| A + B (μm) | 26 | 26 | 20 | 32 |
| A:B | 10:16 | 16:10 | 10:10 | 16:16 |
| Strain (%) | 7.5 | 5.6 | 9.9 | 5.0 |
| Resistance (Ω) | 4.7 | 4.7 | 3.87 | 5.58 |

With reference to FIG. 10 to FIG. 13 and Table 1 above, it may be learned from the data in Table 1 that the stretchable pixel array substrate 10A provided in the embodiment depicted in FIG. 10 has low strain and low resistance. Hence, the stretchability of the stretchable pixel array substrate 10A may be significantly improved on the premise that the resistance of the wiring 120A falls within an acceptable range.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A stretchable pixel array substrate, comprising:
   a base, having a plurality of first regions and a second region, wherein the second region is located among the plurality of first regions;
   a plurality of pixel structures, respectively disposed on the plurality of first regions of the base; and
   a wiring, disposed on the second region of the base and electrically connected to the plurality of pixel structures, wherein the wiring comprises a plurality of curved segments serially connected to each other, each of the plurality of curved segments has a first curved portion, a second curved portion, and a third curved portion, the second curved portion is connected between the first curved portion and the third curved portion, a curved direction of the first curved portion is different from a curved direction of the third curved portion, the third curved portion of each of the plurality of curved segments is connected to the first curved portion of the next curved segment of the plurality of curved segments, and the plurality of curved segments of the wiring comprises:
   a first curved segment, wherein the first curved segment is a curved segment of the wiring closest to one of the plurality of first regions; and
   a second curved segment, wherein one of the plurality of pixel structures is disposed on the one of the plurality of first regions, and the first curved segment is disposed between the one of the plurality of pixel structures and the second curved segment;
   wherein a distance A exists between the first curved portion of the first curved segment and the second curved portion of the first curved segment in a first direction, a distance B exists between the first curved portion of the second curved segment and the second curved portion of the second curved segment in the first direction, and A>B.

2. The stretchable pixel array substrate according to claim 1, wherein 1<(A/B)<10.

3. The stretchable pixel array substrate according to claim 1, wherein 1<(A/B)<4.

4. The stretchable pixel array substrate according to claim 1, wherein the one of the plurality of first regions has a width W, and A<W.

5. The stretchable pixel array substrate according to claim 1, wherein the first curved segment further comprises:
   a first straight portion, connected between the first curved portion and the second curved portion; and
   a second straight portion, connected between the second curved portion and the third curved portion, wherein the first direction intersects with a second direction, and a distance S exists between the first straight portion and the second straight portion in the second direction.

6. The stretchable pixel array substrate according to claim 5, wherein the first straight portion has a length L, and L>S.

* * * * *